United States Patent [19]

Bhattacharyya et al.

[11] 4,333,808

[45] Jun. 8, 1982

[54] METHOD FOR MANUFACTURE OF ULTRA-THIN FILM CAPACITOR

[75] Inventors: Arup Bhattacharyya, Essex Junction, Vt.; Wei-Kan Chu, Poughkeepsie; James K. Howard, Fishkill, both of N.Y.; Francis W. Wiedman, Stowe, Vt.

[73] Assignee: International Business Machines Corporation, Armonk, N.Y.

[21] Appl. No.: 234,084

[22] Filed: Feb. 13, 1981

Related U.S. Application Data

[63] Continuation of Ser. No. 89,710, Oct. 30, 1979, abandoned.

[51] Int. Cl.³ .............................................. C23C 15/00
[52] U.S. Cl. .................................. 204/192 D; 427/38; 427/79; 427/81; 204/192 SP
[58] Field of Search .................. 427/79, 80, 81, 62, 427/63, 38, 376.4, 376.6, 383.9; 250/492 B; 204/192 SP, 192 D

[56] References Cited

U.S. PATENT DOCUMENTS 3,245,895  4/1966  Baker et al. ............................ 427/38
3,988,824 11/1976  Bodway .................................. 427/80
4,038,167  7/1977  Young .................................. 204/192 D

FOREIGN PATENT DOCUMENTS 1086350 10/1967  United Kingdom .................. 427/80
1258259 12/1971  United Kingdom .................. 427/38

OTHER PUBLICATIONS

O'Connell, Formation of Resistive Films by Ion Bombardment, Colloquium on Ion Implantation, London (Jan. 1970).
Basavaiah et al., Annealing Josephson Junction Devices, IBM Tech. Discl. Bul., vol. 17, No. 11, Apr. 1975.

Primary Examiner—Michael R. Lusignan
Assistant Examiner—Richard Bueker
Attorney, Agent, or Firm—George O. Saile

[57] ABSTRACT

A suitable substrate is provided to which is applied a metal electrically conductive film electrode. The substrate and electrically conductive electrode film are then exposed to ion beam implantation of O+ or N+ ions to impregnate the surface of the metal electrode with O+ or N+ ions. Thereafter, the substrate and electrically conductive film having implanted O+ or N+ ions is annealed so as to stabilize the oxide structure which has been implanted into the surface of the electrically conductive film to provide an ultra-thin dielectric film.

6 Claims, 3 Drawing Figures

4,333,808

METHOD FOR MANUFACTURE OF ULTRA-THIN FILM CAPACITOR

This is a continuation, of application Ser. No. 089,710 filed Oct. 30, 1979, now abandoned.

FIELD OF THE INVENTION

The present invention relates to an ultra-thin film capacitor having a metal oxide or metal nitride dielectric and to a method of forming an ultra-thin film capacitor.

BACKGROUND OF THE INVENTION

The manufacture of thin film capacitors is well known. One method for the manufacture of thin film capacitors is to first form a thin film of a metal, such as tantalum, as the first electrode on a dielectric substrate. This composite is then placed in an anodizing bath to form a dielectric layer of tantalum oxide on the tantalum film. This procedure requires a lengthy period of time, thereby adding greatly to the cost of manufacturing a capacitor. Furthermore, the tantalum oxide formed on the tantalum film by the anodizing technique is deficient in oxygen and a relatively thick coating of the tantalum oxide is required to provide acceptable capacitance parameters.

U.S. Pat. No. 4,002,545 to Fehiner et al. describes an improved method of forming a thin film capacitor having a tantalum oxide dielectric. In the method of the Fehiner et al. patent, a non-tantalum electrically conductive film is applied to a dielectric substrate to form a first capacitor electrode. A thin film of tantalum is then applied over the electrode to form an electrically conductive duplex film. The substrate with the applied duplex film is then placed within a vacuum environment containing a mixture of oxygen and an inert gas. A film of tantalum oxide is R-F sputtered over the duplex film within the vacuum environment. The dielectric substrate and duplex film with the tantalum oxide film applied thereon is then cooled and an electrically conductive film is applied over the film of tantalum oxide to form a counter capacitor electrode.

It is indicated in the Fehiner et al. patent that the method of the patent cures the problem of oxygen deficiency which is encountered during R-F sputtering of a tantalum oxide film onto a tantalum substrate. A basic disadvantage of the method of the Fehiner et al. patent and other known methods for making thin film capacitors is that these methods cannot produce a dielectric thickness of less than about 2,000 A which have suitable characteristics in respect to temperature coefficient of capacitance, leakage and loss, particularly at temperatures above 200° C. The requirement for ultra-thin dielectric film has been accentuated recently due to the desire for increased packing densities. A requirement has been set for thin film capacitors having a dielectric constant ($\epsilon$) to thickness (expressed in Angstrom units) ratio of greater than about 0.04. Since most metal oxides suitable for use as a dielectric have a dielectric constant of from about 15 to about 60, a thickness of less than about 1,500 A must be established to meet the $\epsilon/t$ requirement of greater than 0.04.

Accordingly, it is an object of this invention to provide an ultra-thin film capacitor of less than about 1500 A and a method of production of ultra-thin film capacitors which will have desired characteristics of capacitance, temperature coefficient of capacitance, leakage and loss.

SUMMARY OF THE INVENTION

Broadly, according to the present invention, a suitable substrate is provided to which is applied a metal electrically conductive film electrode. The substrate is usually a dielectric or semiconductor material. The substrate and electrically conductive electrode film are then exposed to ion beam implantation of O+ or N+ ions to impregnate the surface of the metal with O+ or N+ ions. The ion beam implantation of O+ and N+ ions is sufficient to provide a stoichiometric excess of O+ or N+ ions. Thereafter, the substrate and electrically conductive film having implanted O+ or N+ ions is annealed under predetermined temperature and time conditions to stabilize the oxide structure which has been implanted into the surface of the electrically conductive film.

In an alternate embodiment of the present invention, a metal oxide coating is deposited on the metal coating. The metal oxide coating is then treated with O+ or N+ ion beam implantation. The provision of a metal oxide coating prior to the ion beam implantation step reduces the dosage level and time required to implant the O+ or N+ ions.

BRIEF DESCRIPTION OF THE DRAWINGS

The principles of the invention will be more readily understood by the detailed description given hereinbelow in conjunction with the drawings which are briefly described below.

DETAILED DESCRIPTION OF THE INVENTION

It should be noted that the drawings are illustrative and symbolic of the invention and there is no intention to indicate scale or relative proportions of the elements shown therein. For ease of description, various aspects of the present invention will be described in connection with the formation of a tantalum oxide film suitable for use as an ultra-thin film dielectric in a capacitor.

Figure 2:
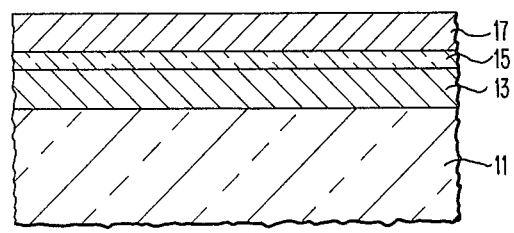
FIG. 2 is a side, partially sectioned view of an ultra-thin film capacitor constructed in accordance with the method of the invention.

Referring to FIG. 2 of the drawings, there is shown a substrate 11, which is usually a dielectric or semiconductor material, to which is applied a metallic electrically conductive thin film electrode 13. The electrode 13 is treated by the method of the invention to provide a layer 15 with implanted O+ or N+ ions.

Figure 3:
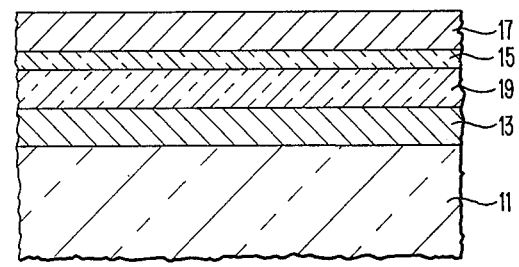
FIG. 3 is a side, partially sectioned view of an alternate embodiment of an ultra-thin film capacitor constructed in accordance with the method of the invention.

A counter electrode 17 is applied to the oxide implanted layer 15. In FIG. 3, a metal oxide layer 19 is applied to the electrode 13 prior to treatment by the method of the invention to provide a layer 15 with implanted O+ or N+ ions. In FIG. 3 the implant layer 15 can extend partially through layer 19 as shown in FIG. 3 or it can extend throughout layer 19. It is also possible to drive the implant layer 15 beneath the surface of the metal layer 13 of FIG. 2 by use of higher energy. In this embodiment, a dielectric layer 15 is formed in situ between the electrode 13 and a counter electrode 17.

As indicated in the discussion of the background of the invention, the provision of an ultra-thin dielectric film is related to high density computer circuit requirements for an $\epsilon/t$ ratio of greater than 0.04. From the required relationship, it can be seen that those metal oxide dielectrics having a dielectric constant of 15 would require a thickness of less than 375 A. As used herein, the symbol "A" is used to designate Angstrom units. It is preferred to use metal oxides having a dielectric constant of at least about 20 requiring a minimum thickness of less than about 500 A.

Preferred metal oxides for use as the dielectric material of the present invention are those rare earth and transition metal oxides having a dielectric constant in excess of 15 and which can be converted to an amorphous structure during ion implantation treatment. Particularly preferred metal oxides for use as the dielectric are tantalum oxide, niobium oxide, titanium oxide and vanadium oxide. Hafnium oxide and zirconium oxide have desirable dielectric constants of about 30 but do not form amorphous structures on ion implant treatment in accordance with the invention. The desirability of forming an amorphous structure during ion implant treatment is discussed hereinbelow under the step of forming the metal oxide coating by R-F sputtering.

Figure 1:
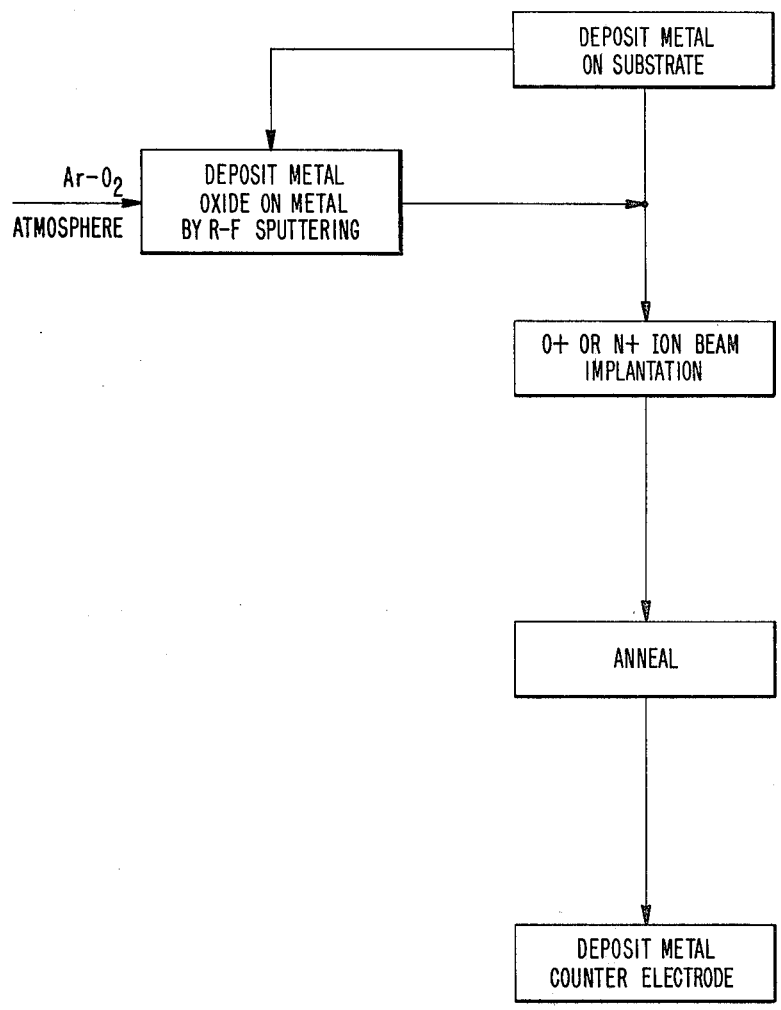
FIG. 1 is a schematic flow sheet of the various steps used in the method of the invention to provide ultra-thin film capacitors.

Referring now to FIG. 1, the first step in the preparation of an ultra-thin film capacitor in accordance with the invention is to form a metal electrically conductive thin film electrode 13 on the surface of a substrate 11. The electrode 13 preferably has a thickness of from about 500 to about 10,000 A. The metal chosen for the electrically conductive thin film electrode 13 should be compatible with the metal oxide film 19 (if used) which is deposited in an alternate embodiment by a step to be described hereinbelow.

If a metal oxide deposition step is not used, the metal electrode 13 is next subjected to ion beam implantation. The dose requirements for effecting ion beam implantation of O+ or N+ ions to the desired thickness on the surface of the metal electrode 13 are quite high and are generally within the range of from about $5 \times 10^{16}$ to about $5 \times 10^{17}$. An energy level of from about 1 keV to about 50 keV can be used for ion implantation. At a current level of 150 $\mu$amp, a time of from about 4 to 20 hours is required to attain the required dosage. The use of higher current levels would reduce the time required to obtain the required dosage.

As indicated, either O+ or N+ ions can be used for this step to provide either an oxide or nitride coating on the surface of the electrode 13. The ion beam implantation is continued until the desired dosage of oxide or nitride coating is implanted on the surface of the thin film electrode 13. For tantalum having a dielectric constant of 25, the thickness of the coating should be less than about 625 A to meet the $\epsilon/t$ requirement of greater than 0.04.

During ion implantation in the metal, the surface of the metal is sputtered off due to the high dosage requirement. During the attainment of an ion implant depth of about 600 A, the surface sputtering will remove from about 500 A to about 1,000 A of the metal.

It has been determined that the dosage requirements and the time for effecting ion beam implantation can be greatly reduced if a metal oxide film is first formed on the surface of the thin film electrode 13. The metal used to form the thin film electrode should be compatible with the metal oxide which is formed thereon. The metal will usually be the metal of the metal oxide coating, however, other metals or polycrystalline Si electrodes can be utilized for certain purposes. The metal oxide coating is formed on the electrode 13 by any suitable method, such as R-F sputtering.

In a preferred method for forming the metal oxide coating, the composite formed by coating the electrode 13 on the dielectric substrate 11 is disposed within a typical R-F sputtering apparatus (not shown) having a target material of the desired metal oxide. The desired metal oxide can also be formed by reactive deposition of the metal in an $Ar/O_2$ gas mixture having a sufficiently high level of oxygen. During R-F sputtering in vacuum, a quantity of a mixture of an inert ionizable gas and oxygen is introduced into the R-F sputtering apparatus. Generally, the proportions of the oxygen and inert gas are from about 2 to about 50% by volume of oxygen and from about 50 to about 98% by volume of the inert gas. Suitable inert gases include argon, xenon, krypton or the like.

In accordance with known technology, sputtering of a metal oxide in an oxygen containing vacuum environment cures the non-stoichiometric condition encountered during R-F sputtering of a metal oxide; that is, the resulting metal oxide layer or film is significantly less oxygen deficient. However, the metal oxide film formed by RF sputtering can exhibit local regions with crystalline structure, which causes high current flow through the crystallites of the structure. The process of the present invention wherein O+ or N+ is implanted within the metal oxide coating changes the crystalline structure to an amorphous structure. An amorphous structure is highly desirable to provide suitable capacitor parameters. It is known that the structure provided by anodizing a metal oxide dielectric onto the surface of a metal is an amorphous structure. However, anodized films have entrapment and corrosion problems when used at the thickness required by the ultra-thin film capacitors of the present invention.

After the metal oxide film is coated onto the metal electrode 13, the composite structure is subjected to ion beam implantation as set forth in the discussion of the capacitor formed using only the metal electrode. The dosage requirements to effect sufficient O+ or N+ ion implantation are significantly reduced with the use of a metal oxide film and a power setting of from about 1 to about 50 keV at a current level of 150 $\mu$amp for a period of from about 1 minute to about 2 hours is sufficient. For this reason, the use of the metal oxide coating prior to ion beam treatment is preferred. Preferably the ion beam implantation of O+ or N+ ions for this embodiment is continued until the dosage is in the range of from about $1 \times 10^{14}$ to about $1 \times 10^{16}$ ions/cm$^2$. Higher dosage levels can be used but do not provide any significant benefits.

After subjecting the composite structure to ion beam implantation, the composite structure is transferred to an annealing oven. It has been determined that an annealing step sets the ions which have been implanted into the surface of the composite structure and greatly enhances the stability of the capacitor during operation. Annealing conditions of from about 150° to about 400° C. in an oxygen ambient for O+ ion implantation and a nitrogen ambient for N+ ion implantation for a period of from about 1 to about 5 hours are suitable to affect annealing and healing of the surface damage caused by ion beam implantation.

EXAMPLES

The following examples further illustrate various features of the invention but are intended to in no way limit the scope of the invention which is defined in the appended claims.

EXAMPLE 1

An ultra-thin film capacitor having the configuration of FIG. 2 was prepared.

A thin film of tantalum was sputtered onto a silicon dioxide substrate. The thickness of the tantalum film was about 2,500 A. The composite structure having the tantalum film thereon was exposed to O+ ion beam implantation. The exposure was at an ion beam energy of 30 keV for 10 hours. At the end of the ion beam exposure a film of about 600 A having an O+ concentration of $1.4 \times 10^{17}$ ions/cm$^2$ had been formed. The structure was then annealed in air at a temperature of 400° C. for a period of 60 minutes to stabilize the implanted film.

A counter electrode of aluminum was then applied to the composite structure by vacuum deposition. The counter electrode had a thickness of 5,000 A.

The resulting capacitor had a capacitance of about 600 pF or $\sim 3.35 \times 10^{-15} (F/\mu^2)$ and a breakdown voltage of about 5 V. Breakdown voltage is defined as that voltage necessary to produce a leakage current equal to or greater than $10^{-4}$ amp. The leakage current at 1 volts was about $10^{-9}$ amp.

EXAMPLE 2

An ultra-thin film capacitor was made in accordance with the structure of FIG. 3. A tantalum coated silicon dioxide dielectric was formed as discussed in Example 1. The composite structure was placed in an R-F sputtering apparatus. The composite structure was exposed to a tantalum oxide target after a vacuum of about $10^{-6}$ Torr was drawn. A quantity of a mixture of oxygen and argon gas was introduced into the apparatus until the vacuum environment reached $5 \times 10^{-3}$ Torr. The oxygen-inert gas mixture contained about 10% by volume of oxygen. The R-F sputtering apparatus was adjusted to energize the tantalum oxide target and sputtering was continued until a layer of tantalum oxide having a thickness of 500 A was obtained.

The tantalum oxide film was then exposed to O+ ion beam treatment at 30 keV for about 30 minutes to produce a uniform amorphous oxide layer. The ion beam treatment was sufficient to implant $2 \times 10^{15}$ ions/cm$^2$.

The structure was then annealed in oxygen at a temperature of 200° C. for a period of 60 minutes to complete the oxidization and stabilize the structure. Thereafter samples with both aluminum and gold counter electrodes were prepared having a thickness of 5,000 A by vacuum evaporation.

The resulting capacitor had a capacitance of 875 pfd and a breakdown voltage of about 5 volts. The leakage current at 1 volt was less than $10^{-10}$ amp for Au electrode samples; samples with Al electrodes yielded higher leakage ($10^{-9}$). The O+ implanted Ta$_2$O$_5$ samples with Au electrodes were stable and yielded low leakage ($<10^{-11}$ amp at 1 volt) following a 300° C. anneal treatment. This high temperature stability is an important property for capacitors to withstand processing temperatures.

Although the present invention has been described with respect to details of certain embodiments thereof it is not intended that such details be limitations on the scope of the claims except insofar as set forth in the following claims.

Having thus described our invention, what we claim as new, and desire to secure by Letters Patent is:

1. A method for manufacture of an ultra-thin film capacitor comprising:
   providing a substrate,
   applying to said substrate a metal electrically conductive film to form a composite having a first capacitor electrode,
   applying by sputtering a film selected from the group consisting of metal oxide films and metal nitride films to the surface of said first electrode;
   the metal of said metal oxide and metal nitride films is selected from the group consisting of tantalum, niobium, titanium, vanadium, hafnium and zirconium;
   subjecting the surface of said metal oxide and metal nitride films to ion implantation treatment to implant ions selected from the group consisting of O+ and N+ ions in the surface of said first electrode;
   subjecting said composite to annealing heat treatment to provide an ultra-thin dielectric film adjacent the surface of said first electrode; and
   applying an electrically conductive film to said composite to form a counter capacitor electrode.

2. A method for manufacture of an ultra-thin film capacitor comprising:
   providing a substrate,
   applying to said substrate a metal electrically conductive film to form a composite having a first capacitor electrode,
   applying by sputtering a film selected from the group consisting of metal oxide films and metal nitride films to the surface of said first electrode,
   the metal of said metal oxide or metal nitride films is selected from the group consisting of tantalum, niobium, titanium, vanadium, hafnium and zirconium;
   subjecting the surface of said metal oxide or metal nitride film to ion implantation treatment to implant ions selected from the group consisting of O+ and N+ ions in the surface of said metal oxide or metal nitride film to form a metal oxide or metal nitride layer having a dielectric constant of from about 15 to about 60;
   subjecting said composite to annealing heat treatment of from about 150° C. to about 400° C. for a period of from about 1 to about 5 hours in an ambient atmosphere selected from oxygen and nitrogen to provide an ultra-thin dielectric film having a dielectric constant to film thickness (expressed in Angstroms) ratio of greater than 0.04, adjacent the surface of said first electrode; and
   applying a metal electrically conductive film to said composite to form a counter capacitor electrode.

3. A method in accordance with claim 2 wherein said metal oxide or metal nitride layer formed by ion implantation is selected from the group consisting of rare earth and transition metal oxides and nitrides having a dielectric constant in excess of 15.

4. A method in accordance with claim 2 wherein said ion implantation treatment is sufficient to implant ions at a level of from about $10^{14}$ to $10^{16}$ ions/cm$^2$.

5. The method of claim 1 or claim 2 wherein said applying by sputtering is in an oxygen containing vacuum environment.

6. The method of claim 5 wherein said oxygen containing environment is about 2 to 50 percent by volume with the remaining gaseous volume being composed of an inert gas.

* * * * *